United States Patent [19]

Furuzawa et al.

[11] Patent Number: 5,547,908
[45] Date of Patent: Aug. 20, 1996

[54] DIELECTRIC CERAMIC COMPOSITION AND PACKAGE MADE OF THE SAME COMPOSITION FOR PACKAGING SEMICONDUCTOR

[75] Inventors: Akira Furuzawa; Akifumi Sata; Takeshi Kubota; Kunihide Shikata, all of Kokubu, Japan

[73] Assignee: Kyocera Corporation, Kyoto, Japan

[21] Appl. No.: 278,175

[22] Filed: Jul. 20, 1994

[30] Foreign Application Priority Data

Jul. 30, 1993 [JP] Japan ................. 5-189707

[51] Int. Cl.$^6$ ................................. C04B 35/46
[52] U.S. Cl. ......................................... 501/136
[58] Field of Search ............................. 501/136

[56] References Cited

U.S. PATENT DOCUMENTS

| | | | |
|---|---|---|---|
| 4,612,140 | 9/1986 | Mandai et al. | 510/136 |
| 4,746,639 | 5/1988 | Sano et al. | 501/136 |

FOREIGN PATENT DOCUMENTS

| | | | |
|---|---|---|---|
| 2641832 | 3/1978 | Germany | 501/136 |
| 033196 | 3/1974 | Japan | 501/136 |
| 0041700 | 12/1979 | Japan | 501/136 |
| 404188506 | 7/1992 | Japan | 501/136 |

*Primary Examiner*—David Brunsman
*Attorney, Agent, or Firm*—Loeb & Loeb LLP

[57] ABSTRACT

A dielectric ceramic composition having a high dielectric constant and a coefficient of thermal expansion nearly comparable with that of alumina, and a package for packaging semiconductor. The dielectric ceramic composition contains 0.1 to 0.6 parts by weight of manganese reckoned as an oxide per 100 parts by weight of chief components of the formula $xTiO_2 \cdot yMgO \cdot zSrO$ or of the formula $xTiO_2 \cdot yMgO \cdot zCaO$ wherein x, y and z are numerals that lie within given ranges. The package for packaging semiconductor comprises a package body composed of alumina and having a semiconductor-mounting portion, and a capacitor made up of a dielectric layer and an electrode layer provided on said semiconductor-mounting portion, wherein the dielectric layer is composed of the $TiO_2$—MgO—SrO—$MnO_2$-type dielectric ceramic or the $TiO_2$—MgO—CaO—$MnO_2$-type dielectric ceramic.

13 Claims, 3 Drawing Sheets

DIELECTRIC CERAMIC COMPOSITION AND PACKAGE MADE OF THE SAME COMPOSITION FOR PACKAGING SEMICONDUCTOR

BACKGROUND OF THE INVENTION

1. Field of the Invention

The present invention relates to a dielectric ceramic composition having a large dielectric constant and a coefficient of thermal expansion nearly comparable with that of alumina, and to a package for packaging semiconductor.

2. Description of the Prior Art

Accompanying the trend toward highly densely integrating the circuits and manufacturing integrated circuits having large capacities in recent years, it has been demanded to produce packages of large sizes for packaging semiconductors or ICs. Furthermore, an increase in the size of the package is accompanied by an increase in the number of connection pins, resulting in an increase in the inductance components due to increased wirings and arousing problems in that noise generates in the output signals of the IC and IC is erroneously operated by undesired reflection. To solve such problems, a ceramic capacitor having a capacitance of about 30 to 100 nF has heretofore been inserted between the power source side and the ground side to absorb noise and to prevent erroneous operation.

In recent years, such a ceramic capacitor has been incorporated in a semiconductor package, and alumina ceramic that is a dielectric has been used as a capacitor of this type. The alumina by itself is an insulator and is a dielectric, too. By utilizing this dielectric, therefore, a capacitor can be incorporated in the package.

However, the alumina has a dielectric constant which is as relatively small as about 9.5 to 10. When a dielectric is formed by alumina, therefore, the area of the dielectric must be increased to obtain a large capacity and besides, the dielectric layers held by the electrode layers must be formed in a plural number, causing the capacitor to become large in size.

A method has been developed to increase the dielectric constant of alumina. However, the dielectric constant is still 18 or smaller. As the ICs having large capacities are being manufactured in recent years, capacitors having large capacitances are demanded resulting, however, in an increase in the size of the capacitor and, hence, in an increase in the size of the package and the substrate because of incorporating such large capacitors and an increase in the cost.

The ceramic capacitor is inserted between the power source side and the ground side. When the capacitor is incorporated in an insulating layer of the package, however, the wiring must be drawn to the ceramic capacitor inevitably accompanied by the build-up of inductance due to the wiring.

SUMMARY OF THE INVENTION

The present inventors have conducted the study to solve the above-mentioned problems and have found a method of obtaining a dielectric ceramic composition having an increased dielectric constant and a coefficient of thermal expansion which is nearly comparable with the coefficient of thermal expansion of the package composed of alumina for packaging semiconductor, the dielectric ceramic composition comprising chiefly $TiO_2$, MgO and SrO or CaO to which is added Mn.

According to the present invention, there is provided a dielectric ceramic composition which contains manganese in an amount of from 0.1 to 0.6 parts by weight reckoned as an oxide per 100 parts by weight of chief components which are represented in mole percent by the following formula $$xTiO_2 \cdot yMgO \cdot zSrO \quad (1)$$

wherein x, y and z are numbers in a region surrounded by the following four points A, B, C and D in a ternary composition,

|   | x    | y    | z  |
|---|------|------|----|
| A | 100  | 0    | 0  |
| B | 72   | 0    | 28 |
| C | 57   | 15   | 28 |
| D | 66.7 | 33.3 | 0  | wherein x+y+z=100.

According to the present invention, furthermore, there is provided a dielectric ceramic composition which contains manganese in an amount of from 0.1 to 0.6 parts by weight reckoned as an oxide per 100 parts by weight of chief components which are represented in mole percent by the following formula $$xTiO_2 \cdot yMgO \cdot zCaO \quad (2)$$

wherein x, y and z are numbers in a region surrounded by the following four points A, B, C and D in a ternary composition,

|   | x    | y    | z    |
|---|------|------|------|
| A | 99.0 | 0    | 1.0  |
| B | 83.3 | 0    | 16.7 |
| C | 61.1 | 22.2 | 16.7 |
| D | 66.0 | 33.0 | 1.0  | wherein x+y+z=100.

According to the present invention, there is further provided a package for packaging semiconductor comprising a package body composed of alumina and having a semiconductor-mounting portion, and a capacitor made up of a dielectric layer and an electrode layer provided on said semiconductor-mounting portion, wherein said dielectric layer is composed of said $TiO_2$—MgO—SrO—$MnO_2$-type dielectric ceramic or said $TiO_2$—MgO—CaO—$MnO_2$-type dielectric ceramic.

DETAILED DESCRIPTION OF THE PREFERRED EMBODIMENTS

Figure 3:
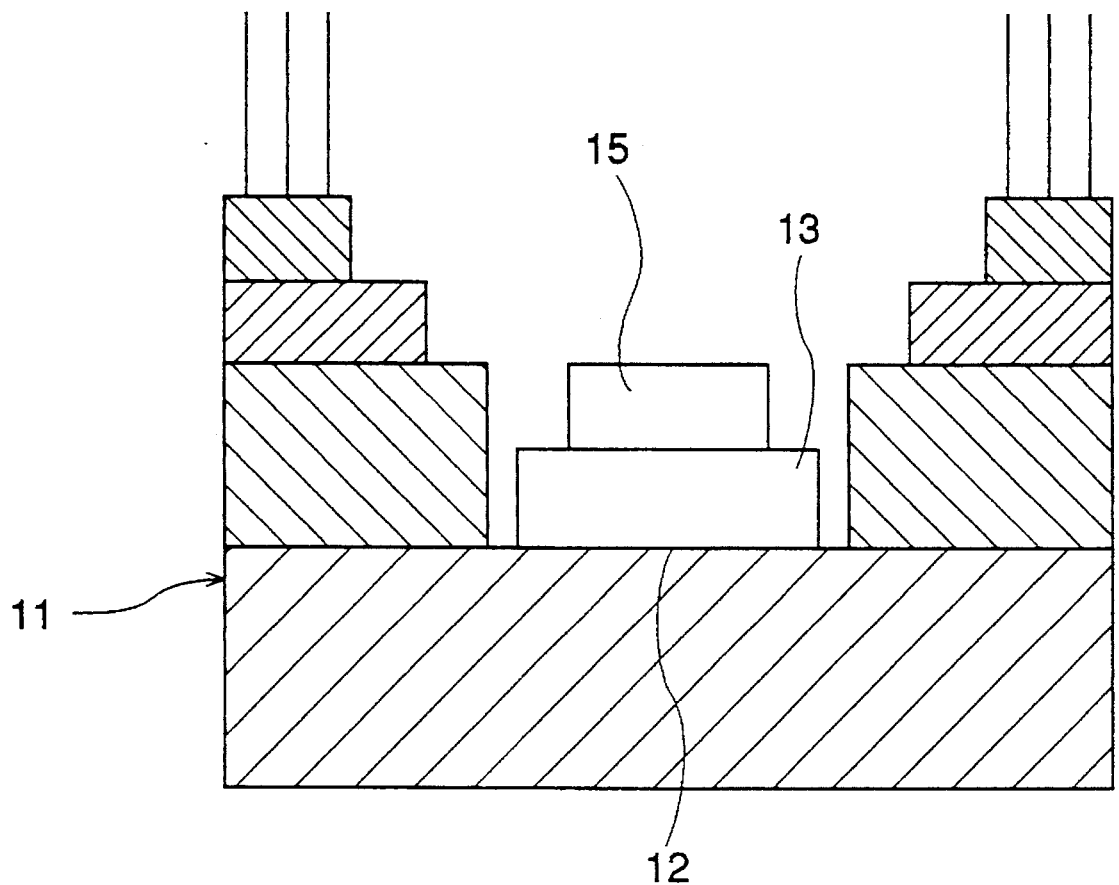
FIG. 3 is a side view illustrating the arrangement of a package for packaging semiconductor according to the present invention.

Referring to FIG. 3 which illustrates a semiconductor package of the present invention, a capacitor 13 is brazed onto a semiconductor-mounting position of a package body 11 made of alumina, and an integrated circuit (IC) device 15 is mounted on the capacitor 13.

The capacitor 13 comprises a laminate of an electrode layer and a dielectric layer. According to the present invention, the dielectric layer is composed of the above-mentioned dielectric ceramic composition. First, the package body 11 composed of alumina has a coefficient of thermal expansion of $7 \times 10^{-6}/°$ C. For being disposed on the package body 11, therefore, the capacitor 13 must have a coefficient of thermal expansion which is smaller than $9.5 \times 10^{-6}/°$ C. by taking the thermal stress due a difference in the coefficient of thermal expansion into consideration.

The dielectric ceramic composition of the present invention contains manganese in an amount of from 0.1 to 0.6 parts by weight and, preferably, from 0.2 to 0.4 parts by weight reckoned as an oxide per 100 parts by weight of chief components which comprise $xTiO_2 \cdot yMgO \cdot zSrO$ or $xTiO_2 \cdot yMgO \cdot zCaO$.

Figure 1:
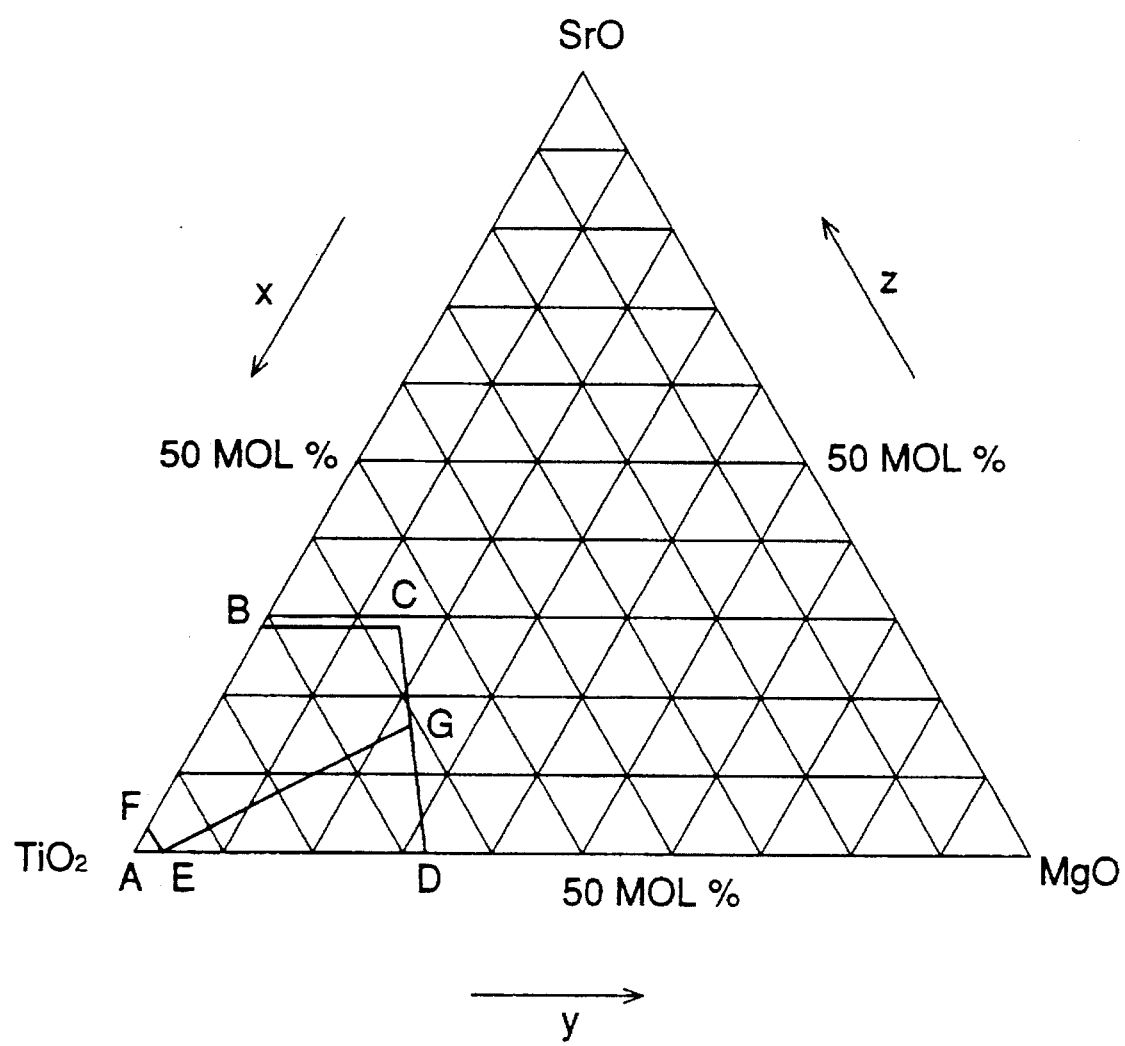
FIG. 1 is a graph illustrating a ternary composition of $TiO_2$, MgO and SrO which are chief components of a dielectric ceramic composition of the present invention.

The range of composition of chief components $xTiO_2 \cdot yMgO \cdot zSrO$ used in the present invention is surrounded by four points A, B, C and D in FIG. 1, i.e., surrounded by,

|   | x | y | z |
|---|---|---|---|
| A | 100 | 0 | 0 |
| B | 72 | 0 | 28 |
| C | 57 | 15 | 28 |
| D | 66.7 | 33.3 | 0 |

The range surrounded by straight lines in FIG. 1 is a range where the following inequalities are satisfied.

$A–B$  $y \geq 0$ (3)

$B–C$  $z \leq 28$ $(15 \geq y > 0)$ (4)

$C–D$  $y \leq 1.897x – 93.103$ $(33.3 \geq y > 15)$ (5)

$D–A$  $z \geq 0$ $(y < 33.3)$ (6)

wherein $x+y+z=100$.

Figure 2:
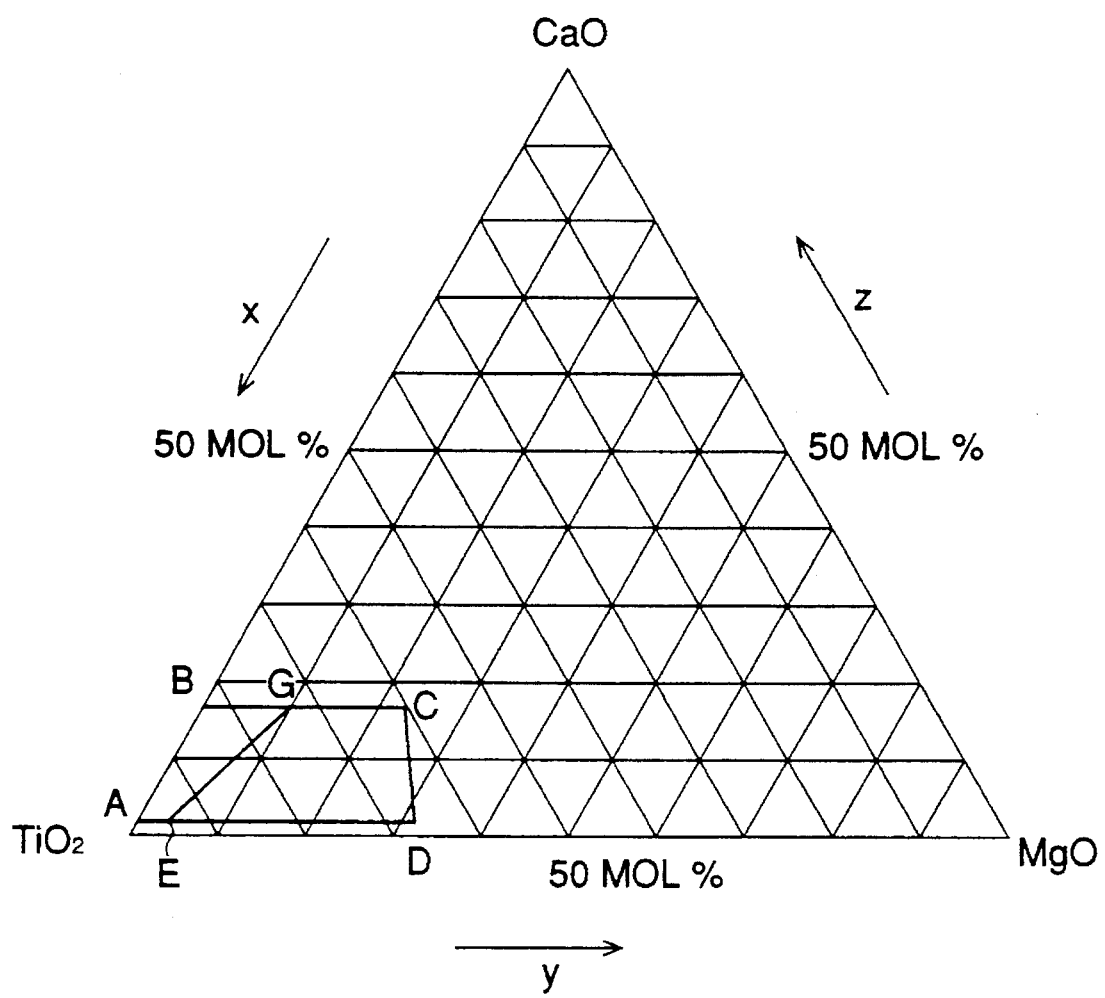
FIG. 2 is a graph illustrating a ternary composition of $TiO_2$, MgO and CaO which are chief components of another dielectric ceramic composition of the present invention.

On the other hand, the range of composition of chief components $xTiO_2 \cdot yMgO \cdot zCaO$ used in the present invention is surrounded by four points A, B, C and D in FIG. 2, i.e., surrounded by,

|   | x | y | z |
|---|---|---|---|
| A | 99.0 | 0 | 1.0 |
| B | 83.3 | 0 | 16.7 |
| C | 61.1 | 22.2 | 16.7 |
| D | 66.0 | 33.0 | 1.0 |

The range surrounded by straight lines in FIG. 2 is a range where the following inequalities are satisfied.

$A–B$  $y \geq 0$ (7)

$B–C$  $z \leq 16.7$ (8)

$C–D$  $y \leq 2.204x – 112.47$ (9)

$D–A$  $z \geq 1$ (10)

wherein $x+y+z=100$.

When sintered, the above-mentioned chief components used in the dielectric ceramic composition of the present invention exhibit a coefficient of thermal expansion which is close to the coefficient of thermal expansion of $7 \times 10^{-6}/°$ C. of an alumina package and further exhibits a large dielectric constant.

Manganese is a component which is indispensable for preventing the ceramic from reducing when it is being fired. That is, when manganese is not added, the ceramic is in a reduced state even under such a firing condition where a sufficiently large sintering density is obtained, and the dielectric loss becomes very great (see Table 1, Sample 1). Therefore, a highly reliable ceramic is not obtained. When manganese is added in an amount of 0.1 part by weight or larger reckoned as an oxide per 100 parts by weight of chief components, however, the dielectric loss becomes very small even under the same firing condition. When manganese is added in an amount of greater than 0.6 parts by weight reckoned as an oxide per 100 parts by weight of chief components, however, the insulation resistance decreases. Therefore, the amount of manganese is limited to be not greater than 0.6 parts by weight. When the amount of manganese lies within a range of from 0.2 to 0.4 parts by weight reckoned as an oxide per 100 parts by weight of chief components, in particular, a stable and high insulation resistance is obtained.

With reference to the case of the $xTiO_2 \cdot yMgO \cdot zSrO$ -type chief components, the dielectric constant of larger than 110 and the insulation resistance of not smaller than $10^{11}$ Ωcm are exhibited even when $TiO_2$ is used alone without arousing any problem from the standpoint of electric properties required for the capacitor. In this case, however, the average grain size becomes not smaller than 25 μm making it difficult to form a thin sheet. Therefore, only a small electrostatic capacity is obtained when a laminated layer structure is fabricated. Because of this reason, $TiO_2$ in the $xTiO_2 \cdot yMgO \cdot zSrO$ system should be smaller than 100 mol % and, particularly, not greater than 99 mol %. When used as the laminated capacitor, furthermore, the ceramic should have an average grain size of not greater than about 10 μm. Here, the amount of $TiO_2$ that is added is specified to be 57 mol % or larger because of the reason that the coefficient of thermal expansion becomes large when the amount is smaller than 57 mol %.

Moreover, addition of SrO makes it possible to decrease the average grain size of the ceramic that is used as the laminated capacitor and to increase the dielectric constant. When SrO is added in an amount smaller than 1 mole%, the dielectric constant becomes smaller than 100, and the average grain size increases beyond 25 μm depending upon the cases. It is therefore desired that SrO is added in an amount of not smaller than 1 mol %. Addition of SrO in such an amount makes it possible to suppress the average grain size to be 10 μm or smaller. Furthermore, in order that the dielectric is not destroyed by the thermal shock of when the package is mounted, the dielectric must have a coefficient of thermal expansion of not greater than $9.5 \times 10^{-6}/°$ C. For this purpose, SrO must be added in an amount of 28 mol % or smaller. That is, when SrO is added in an amount larger than 28 mol %, the coefficient of thermal expansion becomes so large that defects such as cracks develop in the capacitor when it is brazed onto the package body composed of alumina.

When the amount of MgO increases, the grain size of the ceramic decreases and the dielectric constant decreases, too. When the amount of addition of MgO is smaller than 1 mol %, $TiO_2$ exhibits a dielectric constant of as high as 100 or larger but also exhibits a grain size of 25 μm or greater. It is therefore desired that MgO is added in an amount of 1 mol % or larger. Moreover, MgO must be added in an amount which is not larger than 33.3 mol %. That is, when MgO is added in an amount larger than 33.3 mol %, MgTiO$_3$ is formed in addition to MgTi$_2$O$_5$, whereby the coefficient of thermal expansion becomes larger than 9.5×10$^{-6}$/° C., and cracks develop in the capacitor due to the thermal stress when the capacitor is mounted on the package.

A composition in a region surrounded by the aforementioned points B, C, D and the following points E and F of FIG. 1 is desired from the combination of the dielectric constant and the coefficient of thermal expansion,

|   | x  | y | z |
|---|----|---|---|
| E | 99 | 1 | 0 |
| F | 99 | 0 | 1 |

The region on the right side of the line E–F corresponds to an equation, $$E-Fx \leq 99 \quad (11)$$

From the standpoint of obtaining a dielectric ceramic that exhibits a dielectric constant of not smaller than 100, the composition should lie in a region surrounded by points B, C, G, E, and F in FIG. 1, where at the the point G,

|   | x  | y    | z    |
|---|----|------|------|
| G | 62 | 23.5 | 14.5 |

Here, the region on the left side of the line G–E corresponds to an equation, $$G-E\ y \leq -0.608x + 61.203 \quad (12)$$

From the standpoint of dielectric constant, dielectric loss, insulation resistance, coefficient of thermal expansion and thermal conductivity, furthermore, it is most desired that Y≦10 (13) and 15≦Z≦28 (14) in the range surrounded by A, B, C and D in FIG. 1.

The most preferred example is represented by 79 to 80 mol % of TiO$_2$, 4 to 5 mol % of MgO and 16 to 17 mol % of SrO.

With reference to the case of the xTiO$_2$•yMgO•zCaO-type chief components, either Ti$_2$—CaO or TiO$_2$—MgO —CaO may be used but the latter is preferred.

In this case, the grain size can be decreased by adding MgO and/or CaO in an amount of 1 mol % or more to TiO$_2$. When used as a laminated-layer capacitor, furthermore, the ceramic should have an average grain size of about 10 μm or smaller. Here, TiO$_2$ is added in an amount of 61.1 mol % or larger because of the reason that when it is added in an amount smaller than 61.1 mol %, the coefficient of thermal expansion exceeds 9.5×10$^{-6}$/° C. TiO$_2$ should be added particularly in an amount of from 73.3 to 99 mol %.

Being used as the laminated-layer capacitor, furthermore, CaO works to decrease the average grain size in the ceramic as well as to increase the dielectric constant. When CaO is added in an amount of smaller than 1 mol %, however, the average grain size increases often exceeding 25 μm making it difficult to form a thin sheet. When a laminated structure is fabricated, therefore, only a small electrostatic capacity is obtained. Therefore, CaO is added in an amount of 1 mol % or larger. Addition of CaO makes it possible to decrease the average grain size to be 10 μm or smaller. As mentioned above, furthermore, the dielectric must have a coefficient of thermal expansion of not greater than 9.5×10$^{-6}$/° C. so that the dielectric will not be destroyed by the thermal shock at the time when it is mounted on the package. Therefore, CaO must be added in an amount of 16.7 mol % or smaller. That is, when CaO is added in an amount larger than 16.7 mol %, the coefficient of thermal expansion becomes so great that defects such as cracks develop in the capacitor when it is brazed onto the package body composed of alumina.

When the amount of addition of MgO increases, the grain size of the ceramic decreases and the dielectric constant decreases, too. When the amount of addition of MgO becomes smaller than 1 mol %, however, the grain size becomes not smaller than 25 μm though TiO$_2$ exhibits a dielectric constant of not smaller than 100. Therefore, MgO should be added in an amount of 1 mol % or greater. Furthermore, MgO must be added in an amount of not greater than 33.0 mol %. When MgO is added in an amount of greater than 33.0%, MgTiO$_3$ is formed in addition to MgTi$_2$O$_3$ whereby the coefficient of thermal expansion exceeds 9.5×10$^{-6}$/° C., and cracks develop in the capacitor due to the thermal stress when the capacitor is mounted on the package.

From the standpoint of obtaining a dielectric ceramic that exhibits a dielectric constant of not smaller than 100, it is particularly desired that the composition of the xTiO$_2$•yMgO•zCaO-type chief components lie in a region surrounded by points B, G, E and A in FIG. 2, wherein at the points G and E,

|   | x    | y   | z    |
|---|------|-----|------|
| G | 73.3 | 10  | 16.7 |
| E | 97.4 | 1.6 | 1    |

In FIG. 2, the region on the left side of the line G–E corresponds to an equation, $$G-E\ y \leq -0.350 + 35.67 \quad (13)$$

A particularly preferred example is represented by 83 to 99% of TiO$_2$, 0 to 54 of Mg, and 1 to 10% of CaO.

The dielectric ceramic composition of the present invention is obtained by adding up together a powder of TiO$_2$ having an average grain size of from 0.5 to 6 μm, a powder of MgCO$_3$ having an average grain size of from 0.5 to 7 μm, a powder of SrCO$_3$ or CaCO$_3$ having an average grain size of from 0.5 to 7 μm and a powder of MnCO$_3$ having an average grain size of from 0.5 to 30 μm at the above-mentioned ratio, and pulverizing the mixture into a size of from 1.5 to 2 μm by using ZrO$_2$ balls or Al$_2$O$_3$ balls. The mixture is then granulated by adding a binder such as polyvinyl alcohol, molded by a known molding means, and is fired. The molding means may be, for example, a metal mold press, a cold hydrostatic pressure press or an extrusion molding. The firing is effected in an open air at 1200° to 1400° C. for 1 to 2 hours.

When used as a capacitor, a green sheet comprising, for example, the above-mentioned composition and an electrode layer of, for example, Pd or Ag—Pd are alternatingly laminated one upon the other and are simultaneously fired to obtain a capacitor having a high dielectric constant. Such a capacitor is brazed onto the package body that is shown in FIG. 2.

Here, manganese may be added together with other starting materials at the time of preparation, or may be added to TiO$_2$ followed by calcining and is then mixed into other starting materials.

The same effects are obtained even when MgO and TiO$_2$ are mixed together followed by calcining to synthesize MgTi$_2$O$_5$ and then adding TiO$_2$ thereto instead of using MgO. Moreover, the same effects are obtained even when SrO or CaO and TiO$_2$ are mixed together followed by calcining to synthesize SrTiO$_3$ or CaTiO$_3$ and then adding TiO$_2$ thereto instead of using SrO or CaO. The SrTiO$_3$ and the CaTiO₃ have a property of being easily reduced. To prevent this, therefore, manganese may be added in an amount of about 0.2% by weight during the calcining or after the SrTiO₃ or the CaTiO₃ is synthesized and, then, the calcined powder may be added to other starting materials. Here, the components should be added in a manner of forming oxides or of forming oxides upon the firing.

According to the present invention as described above in detail, the $TiO_2$ has a coefficient of thermal expansion of $8.7 \times 10^{-6}/°C$. which is close to the coefficient of thermal expansion of alumina of $7 \times 10^{-6}/°C$. Therefore, the ceramic comprising $TiO_2$, MgO and SrO or CaO as well as Mn exhibits the coefficient of thermal expansion nearly comparable with the coefficient of thermal expansion of alumina and, hence, makes it possible to decrease the thermal stress that generates when it is brazed as a dielectric onto the package. It is therefore allowed to prevent the cracking during the brazing and to avoid the problem of decrease in the insulation resistance.

Furthermore, the $TiO_2$ has a dielectric constant of 110 which is greater than that of alumina making it possible to obtain a ceramic having a large capacitance, i.e., making it possible to obtain a capacitance greater than that of alumina when they have the same structure. Even in obtaining the same capacitance, the capacitor needs have layers in a number smaller than that of the case of alumina or needs have an electrode area smaller than that of the case of alumina, enabling the number of manufacturing steps to be decreased, needing electrode material in reduced amounts, and contributing to decreasing the cost. In the package for packaging semiconductor element of the present invention, furthermore, a capacitor having a large dielectric constant and a coefficient of thermal expansion nearly comparable with that of alumina can be formed just under the semiconductor element making it possible to decrease the inductance due to wiring as small as possible and to obtain a package that is capable of packaging an IC of even a large capacity.

EXAMPLES

The invention will now be described by way of the following examples.

Example 1

A $TiO_2$ powder having an average grain size of 2.5 μm, a $MgCO_3$ powder having an average grain size of 3 μm, an $SrCO_3$ powder having an average grain size of 3 μm and an $MnCO_3$ powder having an average grain size of 17 μm were weighed as starting materials at ratios shown in Table 1 and were wet-pulverized using $ZrO_2$ balls for 20 hours. After drying, the pulverized starting materials were granulated by being mixed with a binder of polyvinyl alcohol, and were molded into an article having a diameter of 16 mm and a thickness of 2 mm under the application of a molding pressure of 1 ton/cm². The molded article was fired in an open air at 1260° to 1400° C. for 2 hours.

An In—Ga electrode was applied onto both side surfaces of the obtained sintered product to obtain an evaluation sample which was then measured for its dielectric constant and dielectric loss under the conditions of 1 MHz, 1 Vrms and was further applied with a direct current of 500 V for one minute to measure its insulation resistance using an insulation resistance tester. The sample was further measured for its coefficient of thermal expansion at 0° to 400° C. by using a TMA, and was measured for its thermal conductivity at room temperature by the laser flash method.

According to Table 1, there are obtained excellent ceramics having high dielectric constants and coefficients of thermal expansion that are smaller than 9.5 when they lie within the range of the present invention.

In the column of dielectric loss of Table 1, (−) indicates that the dielectric loss was so small that it could not be measured.

TABLE 1

| Sample No. | Composition (mol %) | | | $MnO_2$ parts by wt. | Firing temp. (°C.) | Dielectric const. $\varepsilon_r$ | Dielectric loss × $10^{-4}$ | Insulating resistance $\rho$ (Ω cm) × $10^9$ | Coefficient of thermal expansion × $10^{-6}$/°C. | Thermal conductivity (W/m·k) |
|---|---|---|---|---|---|---|---|---|---|---|
| | $TiO_2$ X | MgO Y | SrO Z | | | | | | | |
| *1  | 100  | 0    | 0    | 0   | 1400 | 120.5 | 2500 | 270  | 8.6 | 6.5 |
| 2   | 100  | 0    | 0    | 0.1 | 1340 | 104.4 | 14.2 | 410  | 8.6 | 6.5 |
| 3   | 100  | 0    | 0    | 0.4 | 1340 | 102.1 | 6.6  | 290  | 8.6 | 6.5 |
| 4   | 100  | 0    | 0    | 0.6 | 1340 | 97.5  | 6.7  | 270  | 8.6 | 6.5 |
| 5   | 100  | 0    | 0    | 0.7 | 1340 | 97.0  | 10.8 | 43   | 8.6 | 6.5 |
| 6   | 95   | 5    | 0    | 0.2 | 1260 | 89.7  | 4.5  | 4300 | 8.4 | 6.5 |
| 7   | 86.4 | 4.5  | 9.1  | 0.2 | 1260 | 116.1 | 4.9  | 5000 | 8.5 | 6.8 |
| 8   | 79.2 | 4.2  | 16.6 | 0.2 | 1340 | 146.4 | —    | 4400 | 9.1 | 7.0 |
| 9   | 73.1 | 3.8  | 23.1 | 0.2 | 1300 | 174.5 | —    | 1200 | 9.3 | 7.6 |
| 10  | 68.0 | 4.0  | 28.0 | 0.2 | 1300 | 190.0 | —    | 1500 | 9.5 | 7.9 |
| *11 | 63.3 | 3.4  | 33.3 | 0.2 | 1260 | 204.4 | —    | 1900 | 9.8 | 8.2 |
| 12  | 76.9 | 0    | 23.1 | 0.2 | 1380 | 192.2 | —    | 1400 | 9.3 | 8.0 |
| 13  | 61.5 | 15.4 | 23.1 | 0.2 | 1300 | 121.2 | —    | 380  | 9.3 | 7.6 |
| *14 | 53.8 | 23.1 | 23.1 | 0.2 | 1380 | 112.7 | —    | 600  | 9.6 | 8.5 |
| 15  | 80   | 20   | 0    | 0.2 | 1350 | 57    | 1    | 1000 | 8.4 | 6.3 |
| 16  | 99   | 1    | 0    | 0.2 | 1300 | 100   | 4    | 1100 | 8.1 | 6.2 |
| 17  | 99   | 0    | 1    | 0.2 | 1300 | 100   | 4    | 1000 | 8.1 | 6.2 |
| 18  | 72   | 0    | 28   | 0.2 | 1300 | 200   | 4    | 1000 | 9.5 | 7.9 |
| 19  | 57   | 15   | 28   | 0.2 | 1300 | 150   | —    | 400  | 9.5 | 7.9 |
| 20  | 66.7 | 33.3 | 0    | 0.2 | 1380 | 23    | 4    | 4000 | 9.3 | 6.5 |
| 21  | 79.2 | 4.2  | 16.6 | 0.4 | 1300 | 136   | 4    | 2000 | 9.1 | 6.8 |
| 22  | 79.2 | 4.2  | 16.6 | 0.6 | 1300 | 136   | 7    | 1000 | 9.1 | 6.92 |
| *23 | 79.2 | 4.2  | 16.6 | 1.0 | 1300 | 140   | 20   | 100  | 9.1 | 6.9 |
| *24 | 60   | 30   | 10   | 0.2 | 1400 | 17    | —    | 1000 | 9.4 | 7.5 |
| 25  | 70   | 20   | 10   | 0.2 | 1350 | 72    | 4    | 1000 | 8.5 | 6.8 |

Samples marked with * lie outside the scope of the invention.

Example 2

A TiO$_2$ powder having an average grain size of 2.5 μm, a MgCO$_3$ powder having an average grain size of 3 μm, a CaCO$_3$ powder having an average grain size of 3 μm or smaller and an MnCO$_3$ powder having an average grain size of 17 μm were weighed as starting materials at ratios shown in Table 2 and were wet-pulverized using ZrO$_2$ balls for 20 hours. After dying, the pulverized starting materials were granulated by being mixed with a binder of polyvinyl alcohol, and were molded into an article having a diameter of 16 mm and a thickness of 2 mm under the application of a molding pressure of 1 ton/cm$^2$. The molded article was fired in an open air at temperatures shown in Table 2 for 2 hours.

An In—Ga electrode was applied onto both side surfaces of the obtained sintered product to obtain an evaluation sample which was then measured for its dielectric constant under the conditions of 1 MHz, 1 Vrms and was further applied with a direct current of 500 V for one minute to measure its insulation resistance using an insulation resistance tester. The sample was further measured for its coefficient of thermal expansion at 0° to 400 ° C. by using a TMA. The results were as shown in Table 2.

According to Table 2, there are obtained excellent ceramics having high dielectric constants and coefficients of thermal expansion that are smaller than 9.5 when they lie within the range of the present invention.

TABLE 2

| Sample No. | Composition (mol %) TiO$_2$ x | MgO y | CaO z | MnO$_2$ parts by wt. | Firing temp. (°C.) | Dielectric const. | Resistivity × 10$^{12}$ Ω · cm | Coefficient of thermal expansion × 10$^{-6}$/°C. |
|---|---|---|---|---|---|---|---|---|
| *1 | 99.0 | 0.0 | 1.0 | 0.7 | 1340 | 97 | 0.04 | 8.1 |
| 2 | 99.0 | 0.0 | 1.0 | 0.2 | 1300 | 100 | 1.0 | 8.1 |
| 3 | 90.9 | 0.0 | 9.1 | 0.2 | 1300 | 120 | 8.0 | 9.1 |
| 4 | 86.4 | 4.5 | 9.1 | 0.2 | 1300 | 109 | 8.0 | 9.1 |
| 5 | 83.3 | 0.0 | 16.7 | 0.2 | 1260 | 129 | 40.0 | 9.5 |
| 6 | 80.9 | 14.3 | 4.8 | 0.2 | 1300 | 75 | 3.0 | 8.9 |
| *7 | 73.8 | 3.8 | 23.1 | 0.2 | 1250 | 127 | 60.0 | 9.9 |
| 8 | 73.3 | 10.0 | 16.7 | 0.2 | 1260 | 103 | 18.0 | 9.5 |
| 9 | 72.7 | 18.2 | 9.1 | 0.2 | 1300 | 70 | 4.0 | 9.1 |
| 10 | 66.0 | 33.0 | 1.0 | 0.2 | 1300 | 70 | 4.0 | 9.3 |
| 11 | 66.7 | 16.7 | 16.7 | 0.2 | 1260 | 80 | 9.0 | 9.5 |
| *12 | 66.0 | 13.0 | 21.0 | 0.2 | 1260 | 92 | 62.0 | 9.8 |
| 13 | 61.1 | 22.2 | 16.7 | 0.2 | 1260 | 70 | 8.0 | 9.5 |
| *14 | 59.1 | 31.8 | 9.1 | 0.2 | 1300 | 38 | 6.0 | 9.6 |
| *15 | 58.3 | 25.0 | 16.7 | 0.2 | 1300 | 65 | 9.0 | 9.7 |
| *16 | 53.8 | 23.1 | 23.1 | 0.2 | 1260 | 82 | 85.0 | 10.1 |
| *17 | 61.9 | 33.3 | 4.8 | 0.2 | 1300 | 22 | 5.0 | 9.5 |
| 18 | 99.0 | 0.0 | 1.0 | 0.4 | 1340 | 102 | 1.0 | 8.6 |
| 19 | 99.0 | 0.0 | 1.0 | 0.6 | 1340 | 92 | 0.3 | 8.6 |
| 20 | 65.3 | 21.7 | 13.0 | 0.2 | 1230 | 70 | 8.0 | 9.3 |
| 21 | 74.0 | 13.0 | 13.0 | 0.2 | 1260 | 87 | 10.0 | 9.3 |

Samples marked with * lie outside the scope of the invention

What is claimed is:

1. A dielectric ceramic composition which contains manganese in an amount of from 0.1 to 0.6 parts by weight calculated as an oxide per 100 parts by weight of chief components which are represented in mole percent by the following formula xTiO$_2$·yMgO·zSrO wherein x, y and z are numbers in a region surrounded by the following four points A, B, C and D in a ternary composition,

|   | x | y | z |
|---|---|---|---|
| A | 100 | 0 | 0 |
| B | 72 | 0 | 28 |
| C | 57 | 15 | 28 |
| D | 66.7 | 33.3 | 0 | wherein x+y+z=100, and wherein the dielectric ceramic composition has a coefficient of thermal expansion not larger than 9.5×10$^{-6}$/°C. at a temperature ranging from 0° to 400° C.

2. A dielectric ceramic composition according to claim 1, wherein the TiO$_2$ content (x) in the chief components is from 57 to 99 mol %, the MgO content (y) is from 1 to 33.3 mol %, and the SrO content (z) is from 1 to 28 mol %.

3. A dielectric ceramic composition according to claim 1, wherein the TiO$_2$ content (x) in the chief components is from 72 to 85 mol %, the MgO content (y) is from 3 to 5 mol %, and the SrO content (z) is from 8 to 24 mol %.

4. A dielectric ceramic composition according to claim 1, wherein manganese is contained in an amount of from 0.2 to 0.4 parts by weight reckoned as an oxide per 100 parts by weight of the chief components.

5. A dielectric ceramic composition according to claim 1, wherein the TiO$_2$ content (x), MgO content (y) and SrO content (z) of the chief components lie within a region surrounded by the following points B, C, D, E and F,

|   | x | y | z |
|---|---|---|---|
| B | 72 | 0 | 28 |
| C | 57 | 15 | 28 |
| D | 66.7 | 33.3 | 0 |
| E | 99 | 1 | 0 |
| F | 99 | 0 | 1 |

6. A dielectric ceramic composition according to claim 1, wherein the TiO$_2$ content (x), MgO content (y) and SrO content (z) of the chief components lie within a region surrounded by the following points B, C, G, E and F,

|   | x  | y    | z    |
|---|----|------|------|
| B | 72 | 0    | 28   |
| C | 57 | 15   | 28   |
| G | 62 | 23.5 | 14.5 |
| E | 99 | 1    | 0    |
| F | 99 | 0    | 1    |

7. A dielectric ceramic composition according to claim 1, wherein manganese is contained in an amount of from about 0.2 to about 0.4 parts by weight reckoned as an oxide per 100 parts by weight of chief components which comprise about 79 to about 80 mol % of $TiO_2$, about to about 5 mol % of MgO, and about 16 to 17 mol % of SrO.

8. A dielectric ceramic composition which contains manganese in an amount of from 0.1 to 0.6 parts by weight calculated as an oxide per 100 parts by weight of chief components which are represented in mole percent by the following formula $$xTiO_2 \cdot yMgO \cdot zCaO$$

wherein x, y and z are numbers in a region surrounded by the following four points A, B, C and D in a ternary composition,

|   | x    | y    | z    |
|---|------|------|------|
| A | 99.0 | 0    | 1.0  |
| B | 88.3 | 0    | 16.7 |
| C | 61.1 | 22.2 | 16.7 |
| D | 66.0 | 33.0 | 1.0  | wherein x+y+z=100, and wherein the dielectric ceramic composition has a coefficient of thermal expansion not larger than $9.5 \times 10^{-6}/°C$. at a temperature ranging from 0° to 400° C.

9. A dielectric ceramic composition according to claim 8, wherein the $TiO_2$ content (x) in the chief components is from 73.3 to 99 mol %, the MgO content (y) is from 1 to 33.3 mol %, and the CaO content (z) is from 1 to 16.7 mol %.

10. A dielectric ceramic composition according to claim 8, wherein the $TiO_2$ content (x) in the chief components is from 73.3 to 99 mol %, the MgO content (y) is from 0 to 10 mol %, and the CaO content (z) is from 1 to 16.7 mol %.

11. A dielectric ceramic composition according to claim 8, wherein manganese is contained in an amount of from 0.2 to 0.4 parts by weight reckoned as an oxide per 100 parts by weight of the chief components.

12. A dielectric ceramic composition according to claim 8, wherein the $TiO_2$ content (x), MgO content (y) and CaO content (z) of the chief components lie within a region surrounded by the following points B, G, E and A,

|   | x    | y   | z    |
|---|------|-----|------|
| B | 83.3 | 0   | 16.7 |
| G | 73.3 | 10  | 16.7 |
| E | 97.4 | 1.6 | 1    |
| A | 99.0 | 0   | 1.0  |

13. A dielectric ceramic composition according to claim 8, wherein manganese is contained in an amount of from about 0.2 to about 0.4 parts by weight as an oxide per 100 parts by weight of chief components comprising 83 to 99 mol % of $TiO_2$, 0 to 5 mol % of MgO, and 1 to 10 mol % of CaO.

* * * * *